US012607681B2

(12) United States Patent
Ikeda et al.

(10) Patent No.: US 12,607,681 B2
(45) Date of Patent: Apr. 21, 2026

(54) METHOD OF SELF-DISCHARGE TEST FOR SECONDARY BATTERY AND MANUFACTURING METHOD FOR SECONDARY BATTERY

(71) Applicants: Prime Planet Energy & Solutions, Inc., Tokyo (JP); TOYOTA JIDOSHA KABUSHIKI KAISHA, Aichi-ken (JP); PRIMEARTH EV ENERGY CO., LTD., Shizuoka-ken (JP)

(72) Inventors: Hiroaki Ikeda, Toyota (JP); Toshiki Yoneyama, Toyohashi (JP)

(73) Assignees: PRIME PLANET ENERGY & SOLUTIONS, INC., Tokyo (JP); TOYOTA JIDOSHA KABUSHIKI KAISHA, Aichi-Ken (JP); TOYOTA BATTERY CO., LTD., Shizuoka-Ken (JP)

( * ) Notice: Subject to any disclaimer, the term of this patent is extended or adjusted under 35 U.S.C. 154(b) by 248 days.

(21) Appl. No.: 18/451,842

(22) Filed: Aug. 18, 2023

(65) Prior Publication Data

US 2024/0103086 A1 Mar. 28, 2024

(30) Foreign Application Priority Data

Sep. 22, 2022 (JP) ................................ 2022-150810

(51) Int. Cl.
*G01R 31/3835* (2019.01)
*H01M 10/44* (2006.01)
*H01M 10/48* (2006.01)

(52) U.S. Cl.
CPC ...... *G01R 31/3835* (2019.01); *H01M 10/446* (2013.01); *H01M 10/48* (2013.01)

(58) Field of Classification Search
CPC ........................ G01R 31/3835; H01M 10/446; H01M 10/48; H01M 10/42; H01M 10/4285; H01M 10/44; Y02E 60/10; Y02P 70/50
See application file for complete search history.

(56) References Cited

U.S. PATENT DOCUMENTS

2008/0258683 A1* 10/2008 Chang ................... H02J 7/0016
320/135
2012/0176140 A1* 7/2012 Kitsuani .............. G01R 31/385
324/433

(Continued)

FOREIGN PATENT DOCUMENTS

JP 2002-352864 A 12/2002
JP 2011-069775 A 4/2011

(Continued)

*Primary Examiner* — Giovanni Astacio-Oquendo
*Assistant Examiner* — Haidong Zhang
(74) *Attorney, Agent, or Firm* — HAUPTMAN HAM, LLP

(57) ABSTRACT

A method of self-discharge test for a battery including an electrode body provided with a positive electrode plate including a positive active material layer and a negative electrode plate including a negative active material layer. The method includes a process of voltage adjusting to adjust a battery voltage to a first battery voltage and a process of self-discharge testing to keep the battery in a terminal open state for a predetermined term and to inspect a state of self-discharge of the battery from variations in the battery voltage occurred during the predetermined term. The voltage adjusting is to adjust the battery voltage to the first battery voltage having magnitude, for which a variation settled time of settling a variation amount of the battery voltage varied by Li diffusion to lessen a concentration gap of an opposing-portion concentration and a non-opposing portion concentration, is set as 17 hours or less.

8 Claims, 6 Drawing Sheets

(56) References Cited

U.S. PATENT DOCUMENTS

| | | | | | |
|---|---|---|---|---|---|
| 2012/0319693 | A1* | 12/2012 | Yoshioka | ............ | H01M 50/204 |
| | | | | | 324/426 |
| 2013/0059207 | A1* | 3/2013 | Takahata | ............... | H01M 4/133 |
| | | | | | 429/231.8 |
| 2017/0162912 | A1* | 6/2017 | Ueno | ................ | H01M 10/0587 |

FOREIGN PATENT DOCUMENTS

| | | | |
|---|---|---|---|
| JP | 2014-134395 | A | 7/2014 |
| JP | 2015-090806 | A | 5/2015 |
| JP | 2018-081746 | A | 5/2018 |

* cited by examiner

FIG. 6

METHOD OF SELF-DISCHARGE TEST FOR SECONDARY BATTERY AND MANUFACTURING METHOD FOR SECONDARY BATTERY

CROSS-REFERENCE TO RELATED APPLICATIONS

This application is based upon and claims the benefit of priority from the prior Japanese Patent Application No. 2022-150810 filed on Sep. 22, 2022, the entire contents of which are incorporated herein by reference.

BACKGROUND

Technical Field

The present disclosure relates to a method of self-discharge test for a secondary battery and a manufacturing method for the secondary battery.

Related Art

In manufacturing a secondary battery, a self-discharge test for measuring magnitude of the self-discharge and for determining presence or absence of short-circuit has been performed. For example, the Japanese Patent Application Publication No. 2014-134395 has disclosed a short-circuit inspecting method for a secondary battery. The method includes: an SOC adjusting process of discharging the secondary battery (hereinafter, also referred as a battery) which has been initially charged in an initial activating process to adjust an SOC value; a self-discharging process to self-discharge the battery by leaving the battery which has been adjusted to a predetermined battery voltage; and a process of checking presence or absence of short-circuit based on an amount of voltage drop in the battery during the self-discharging process. This method has been adopted because the battery with short-circuit causes a large amount of the voltage decrease during the self-discharging process as compared with the battery with no short-circuit.

SUMMARY

Technical Problems

When the battery is set at a predetermined battery voltage and is left to stand thereafter, the battery with short-circuit largely decreases in its battery voltage as compared with the battery with no short-circuit in the same period of term as mentioned above. This is because self-discharge to discharge electric charge (charge) stored in the battery occurs through a short-circuit portion in the battery. Under a condition that a resistance value of the short-circuit portion remains unchanged with time, discharging is mostly performed as constant current discharge, and thus the battery voltage of the battery with short-circuit decreases mostly at a constant rate except a case where the battery voltage varies non-linearly with respect to a stored charge amount such as a case of the low SOC of the battery (for example, a case of SOC of 10% or less). Herein, the smaller the resistance value of the short-circuit portion is, the larger the decrease rate becomes.

However, decrease in the battery voltage due to the above-mentioned self-discharge is not the only reason for variations in the battery voltage which has occurred while the battery is adjusted with its battery voltage to a predetermined battery voltage VB and then left to stand. Detailed explanation is given below.

Firstly, in adjusting the battery to the predetermined battery voltage VB, a case of adjusting the battery by CCCV charging to a target voltage is considered. In this case, CC charging (constant current charging) is performed until the battery voltage VB reaches the target voltage (cut-off voltage value). When the battery voltage VB has reached the target voltage, the charging is switched to CV charging (constant voltage charging). Then, battery current IB flowing in the battery gradually decreases with time. The CV charging is then terminated at the time when the battery current IB has reached a cut-off current value. Thus, the battery is determined to reach the target battery voltage. However, at this final phase of the CCCV charging, the battery current IB at the cut-off current value flows in the battery.

The battery is expressed by an equivalent circuit (see FIG. 3 which will be explained below) with a battery capacity Cs, a parallel resistance Rp corresponding to an insulation resistance of the battery capacity Cs and connected in parallel with the battery capacity Cs, and a serial resistance Rs connected in series with these parallel circuits to indicate each amount of resistance of respective portions of the battery. The battery thus includes the serial resistance Rs, and accordingly, when the battery current IB flows in the battery, an apparent battery voltage VB appears to be larger than a battery capacity voltage VCs (corresponding to an open battery voltage) of the battery capacity Cs by an amount of the voltage drop in the serial resistance Rs. Conversely, the battery voltage VB is equal to the target battery voltage directly before termination of the CCCV charging, but directly after completion of the CCCV charging, the battery voltage VB decreases by the amount of the voltage generated in the serial resistance Rs. This is because the battery current IB is no longer supplied (IB=0) from outside due to termination of the CCCV charging. This voltage change (namely, decrease in the battery voltage VB in a case of charging and increase in the battery voltage VB in a case of discharging) by stopping flowing the battery current IB occurs immediately on or after completion of adjusting the battery voltage VB by the CCCV charging and others, specifically within a couple of seconds to a couple of minutes, for example.

In a stage of manufacturing batteries, the non-defective batteries with no short-circuit are initially charged, and thereafter, charging and discharging for capacity test and others are performed. Further, there is a case that each of the batteries is charged by the CCCV charging or the like to adjust the battery voltage VB to a predetermined value and then left to stand to undergo the self-discharge test for the battery for determining presence or absence of the short-circuit. In this case, the battery voltage VB decreases directly after completion of adjusting the battery voltage VB because of existence of the above-mentioned serial resistance Rs.

Decline in the voltage continues thereafter with lapse of time, but the rate of voltage decline gradually slows down for about a period of one hundred days to a couple of hundreds of days. Finally, the battery takes behavior of having an almost constant battery voltage value.

This long-term behavior of the voltage decline is considered to be obtained in a manner that SEI coating formation to a surface of active material particles by reaction with electrolytic solution gets slow down with time, and decline in the battery voltage is settled by this coating formation. In other words, in manufacturing a battery which has been performed with initial charging and charging and discharging, magnitude of a decrease amount of the battery voltage during the test term varies depending on a length of elapsed time from completion of adjusting the voltage to the predetermined battery voltage by charging or discharging to start of self-discharge test or short-circuit inspection. Further, the decrease amount of the battery voltage varies depending also on a length of a term (a leaving term) from pre-leaving voltage measurement to post-leaving voltage measurement.

In addition to the above, there is also considered variations in the battery voltage VB in association with variation in negative-electrode potential due to diffusion of charge carrier atoms (for example, Li atoms) in a negative active material layer. In the battery, a negative active material layer has a wider area than a positive active material layer and thus a positive electrode plate and a negative electrode plate are placed so that the negative active material layer exists to oppose any parts of the positive active material layer. This is because Li ions emitted from the positive active material layer during charging are assuredly received by the negative active material layer. Accordingly, the negative active material layer of the negative electrode plate includes not only an opposing portion opposing the positive active material layer through a separator but also a non-opposing portion positioned around the opposing portion not to oppose the positive active material layer. In such a configuration, the opposing portion of the negative active material layer is inserted with the Li ions, but the Li ions are not inserted in the non-opposing portion during charging, for example. As a result of this, there may be a difference (Li concentration gap) in an amount of Li (Li concentration) per unit of area (or per unit of volume) of the opposing portion and the non-opposing portion, and the local negative-electrode potential might be different in the opposing portion and the non-opposing portion from each other. To be specific, while the negative-electrode potential of the opposing portion with high Li concentration is lowered, the negative-electrode potential of the non-opposing portion with low Li concentration is relatively high. Herein, the negative-electrode potential generated in the negative electrode plate is mainly determined by the negative-electrode potential of the opposing portion, but finally determined as an integrated negative-electrode potential including that of the non-opposing portion. Further, the battery voltage VB observed from outside is obtained as a gap between a positive-electrode potential and the integrated negative-electrode potential.

The Li concentration gap between the opposing portion and the non-opposing portion of the negative active material layer is gradually lessened with the elapse of time by the Li diffusion, and after elapse of enough time, the Li concentration gap is resolved, so that the opposing portion and the non-opposing portion have the same Li concentration. Accordingly, the local gap in the negative-electrode potential between the opposing portion and the non-opposing portion is gradually eliminated, and thus variation (rise or drop) in the negative-electrode potential of the negative electrode plate and variation (drop or rise) in the battery voltage VB also become gradually small. This variation in the battery voltage by the Li diffusion depends on a temperature of the battery, a degree of the Li concentration gap, and others, but such a variation is resolved mostly within a couple of days to a week when the battery is left to stand at a normal temperature, for example.

Therefore, when voltage adjusting to adjust the battery voltage VB to the predetermined value by the CCCV charging or the like is performed and then the self-discharge test for the battery is to be performed, the self-discharge test for the battery cannot be performed instantly after the battery adjusting. Namely, there needs to wait for start of the self-discharge test for one to several days after completion of voltage adjusting until the variation in the battery voltage VB by the Li diffusion between the opposing portion and the non-opposing portion is settled to some extent. If the battery voltage VB varies in association with the Li diffusion when the presence or absence of the short-circuit in the battery or a state of the self-discharge of the battery are to be inspected from a decrease rate of the battery voltage VB during the self-discharge test, there are possibilities that the state of self-discharge cannot be inspected properly and that inspection accuracy is degraded.

Herein, the voltage variation caused by the above-mentioned SEI formation represents change in the voltage in a manufacturing stage on or after the initial charging of the battery. Further, as mentioned above, a term of one hundred days or more is required for termination of the voltage change due to the SEI formation. As a result, when the self-discharge test is to be started within a couple of days from completion of the voltage adjusting, mostly linear voltage decrease by SEI coating formation can be expected, and thus the self-discharge test would have no influence from the voltage decrease.

The present disclosure has been made in view of the above circumstances and has a purpose of providing a method of self-discharge test for a secondary battery and a manufacturing method for a secondary battery utilizing this testing method in which the secondary battery can be transferred to the self-discharge test in a short wait time after adjusting the secondary battery to a first battery voltage.

Means of Solving the Problems (1) One aspect of the present disclosure to solve the above problem is a method of self-discharge test for a secondary battery comprising an electrode body provided with a positive electrode plate including a positive active material layer and a negative electrode plate including a negative active material layer, the negative active material layer including an opposing portion opposing the positive active material layer and a non-opposing portion failing to oppose the positive active material layer, wherein the method includes: adjusting a battery voltage to a first battery voltage by any one of charging and discharging of the secondary battery; and self-discharge testing a state of self-discharge of the secondary battery by variation in the battery voltage for a predetermined term for which the secondary battery is kept in a terminal open state, and the adjusting the battery voltage is to adjust the first battery voltage having magnitude which satisfies a variation settled time of 17 hours or less from adjustment completion time of adjusting the battery voltage to the first battery voltage, the variation settled time being a time of settling a variation amount of the battery voltage varied by diffusion of charge carrier atoms that are diffused to lessen a concentration gap between an opposing-portion concentration as a concentration of the charge carrier atoms existing in the opposing portion of the negative active material layer and a non-opposing-portion concentration as a concentration of the charge carrier atoms existing in the non-opposing portion of the negative active material layer.

According to this method of self-discharge test for the secondary battery, the magnitude of the first battery voltage in the process of adjusting the battery voltage is set such that the variation settled time for settling the variation amount of the battery voltage, which is varied by diffusion of the charge carrier atoms such as Li, is set to be within 17 hours (about 0.7 day) from the adjustment completion time. By this configuration of setting the magnitude of the first battery voltage, a total amount of variation in the battery voltage varied by diffusion of the Li or the like can be made smaller and the variation settled time can be made shorter to 17 hours or less as compared with a case of 24 hours or more (for example, one day to a couple of days).

Accordingly, when the process of self-discharge testing the state of self-discharge to measure the magnitude of the self-discharge and to determine presence or absence of the short-circuit from the decrease amount or the decrease rate of the battery voltage is started instantly after completing the process of adjusting, the process of self-discharge testing can be accurately performed with less influence of variation in the battery voltage due to the diffusion of the charge carrier atoms. Further, when the process of self-discharge testing is started after the variation of the battery voltage due to the diffusion of the charge carrier atoms have been lessened enough, the process of self-discharge testing can be started further earlier, and thus the process of self-discharge testing can be finished earlier.

The variation settled time of the variation amount of the battery voltage due to the diffusion of the charge carrier atoms can be determined as follows. Specifically, variations in the battery voltage are examined from the adjustment completion time when the battery voltage has been adjusted to the first battery voltage in the process of adjusting the battery voltage until the battery voltage decreases as if the battery voltage decrease proceeds on a straight line. Subsequently, the straight line is extended to go back in time to the adjustment completion time to obtain a one-hour-later separation amount which is a gap between the battery voltage (one-hour-later voltage) after elapse of one hour since adjusting completion and an on-line value (one-hour-later on-line value). An elapsed time required for reducing the separation amount of the obtained battery voltage and the value (on-line value) on the above-mentioned straight line to 10% of the one-hour-later separation amount is determined as the variation settled value.

As a "secondary battery", there are exemplified a lithium-ion secondary battery, a sodium-ion secondary battery, and others, for example. Further, as "charge carrier atoms", Li atoms are exemplified in the lithium-ion secondary battery, and Na atoms are exemplified in the sodium-ion secondary battery.

As a "negative active material layer", there are exemplified a layer including a negative active material formed of carbon-based substance such as graphite, which can be inserted with the charge carrier atoms such at Li atoms.

Further, the process of "self-discharge testing a state of self-discharge" includes tests such as measuring the magnitude of the self-discharge of the battery, namely the magnitude of the above-mentioned parallel resistance, determining presence or absence of the short-circuit in the battery, and stratifying the batteries according to the magnitude of the self-discharge in ranks.

The "diffusion of the charge carrier atoms" includes both forward diffusion in which the charge carrier atoms such as Li are transferred from the opposing portion to the non-opposing portion of the negative active material layer and inverse diffusion in which the charge carrier atoms such as Li are transferred from the non-opposing portion to the opposing portion.

(2) The method of self-discharge test for the secondary battery according to the above (1), preferably, the adjusting the battery voltage is to adjust the magnitude of the first battery voltage with the variation settled time of 5 hours or less from the adjusting completion time.

In this method of the self-discharge test for the secondary battery, the first battery voltage is set to be magnitude by which the variation settled time becomes within 5 hours (about 0.2 days). Accordingly, when the process of self-discharge testing is started instantly after completion of the process of adjusting the battery voltage, the self-discharge test can be performed further accurately. Alternatively, the self-discharge test can be started earlier.

(3) In the method of self-discharge test for the secondary battery according to the above (1) or (2), the self-discharge testing includes: measuring a pre-leaving battery voltage of the secondary battery; leaving the secondary battery, which has been measured with the pre-leaving battery voltage, in the terminal open state for the predetermined period of time; measuring a post-leaving battery voltage of the secondary battery after the leaving the secondary battery; measuring a measured voltage decrease rate between the pre-leaving battery voltage and the post-leaving battery voltage of the secondary battery; and determining the magnitude of self-discharge of the secondary battery by use of the measured voltage decrease rate of the secondary battery.

In the above method of the self-discharge test for the secondary battery, separately from the process of adjusting the battery voltage to the first battery voltage, the pre-leaving battery voltage is measured and then the voltage decrease rate is actually measured. Therefore, presence or absence of the short-circuit in the battery and the magnitude of the self-discharge can be appropriately inspected.

(4) Another aspect of the present disclosure is, preferably, to provide a manufacturing method for a secondary battery including: initial charging the secondary battery to an initial voltage; adjusting and testing a magnitude of self-discharge of the secondary battery by the self-discharge testing according to any one of the above (1) to (3); and excluding the secondary battery that has been determined to have short-circuit in the self-discharge testing.

In this manufacturing method for the secondary battery, the initial charging is performed, and then, the process of self-discharge testing is performed in the process of adjusting and testing, and batteries which have been determined to have short-circuit are excluded in the subsequent process of excluding. Thus, only batteries that have been determined not to have short-circuit can be manufactured.

BRIEF DESCRIPTION OF THE DRAWINGS

FIG. 6 is an explanatory table for explaining concentration and diffusion transfer of Li in a positive active material layer and a negative active material layer of the respective batteries in the examples 1 and 2 and the comparative examples 1 and 2, in which a column (a) indicates a time before initial charging, (b) indicates a time of completion of initial charging, (c) indicates a time after high-temperature aging, (d) indicates a time of completion of adjusting, and (e) indicates a time after completion of adjusting.

DETAILED DESCRIPTION OF THE EXEMPLARY EMBODIMENTS

Embodiment

Figure 1:
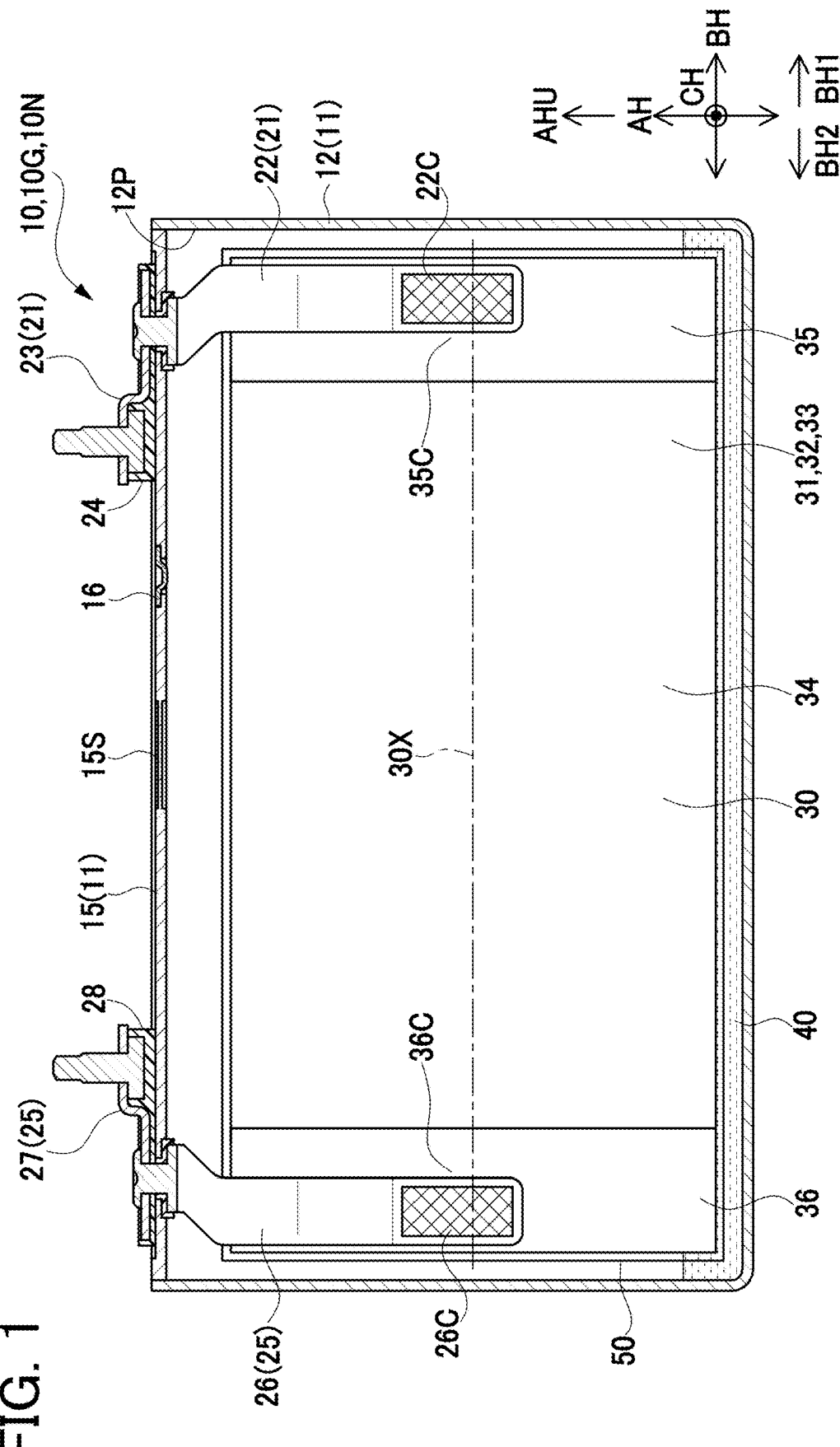
FIG. 1 is an explanatory view of a battery in an embodiment.

An embodiment of the present disclosure is explained below with reference to the accompanying drawings. FIG. 1 is a vertical sectional view of a battery 10 according to the present embodiment (examples 1 and 2 and comparative examples 1 and 2 which will be explained later). This battery 10 is for example, a rectangular hermetically-closed lithium-ion secondary battery mounted on vehicles such as a hybrid vehicle, a plug-in hybrid vehicle, and an electric vehicle, a drone, and various equipment.

The battery 10 is configured with components such as a case 11, an electrode body 30 housed inside the case 11, a positive terminal 21 and a negative terminal 25 which are supported by the case 11 and connected to the electrode body 30 inside the case 11 but are protruding outside the case 11 (an upper side in FIG. 1).

Among these components, the case 11 is made of metal (in the present embodiment, aluminum) and of a rectangular-parallelepiped box-like shape. This case 11 includes a case body 12 of a bottomed rectangular-cylindrical shape including an opening 12P on an upper side AHU in a battery height direction AH and a lid 15 of a rectangular plate-like shape for closing the opening 12P. The battery height direction AH, a battery widthwise direction BH, and a battery thickwise direction CH are directions as represented in FIG. 1 for explanation.

To the lid 15, the positive terminal 21 made of aluminum is fixed in an insulated state from the lid 15 by a positive electrode insulation member 24. Specifically, in the positive terminal 21, a positive inner terminal member 22 is connected to a positive current collecting portion 35 explained later of the electrode body 30 by a connecting portion 22C and also conductively connected to a positive outer terminal member 23 through the lid 15.

Further to the lid 15, the negative terminal 25 made of copper is fixed in an insulated state from the lid 15 by a negative electrode insulation member 28. Specifically, in the negative terminal 25, a negative inner terminal member 26 is connected to a negative current collecting portion 36 explained later of the electrode body 30 by a connecting portion 26C and also conductively connected to a negative outer terminal member 27 through the lid 15.

Further, in the case 11, an electrolytic solution 40 is housed with the electrode body 30. A part of the solution is impregnated in the electrode body 30 and another part resides in a bottom part of the case 11. Furthermore, the electrode body 30 is covered with an insulation film 50 of a bottomed rectangular bag-like shape with opening on the upper side AHU in the battery height direction AH.

The electrode body 30 is almost of a flat parallelepiped shape formed by winding the strip-shaped positive electrode plate 31, the strip-shaped negative electrode plate 32, and two strip-shaped separators 33 made of resin-made porous film, which are interposed between the positive electrode plate 31 and the negative electrode plate 32, and by pushing to flatten them to form a flat-wound electrode body. Accordingly, as shown in FIG. 2, the positive electrode plate 31 and the negative electrode plate 32 are intermittently laminated via the separators 33.

The strip-shaped positive electrode plate 31 has a positive current collecting foil 311 formed of a rectangular aluminum foil and positive active material layers 312 which are provided on both main faces of the positive current collecting foil 311. The strip-shaped negative electrode plate 32 has a negative current collecting foil 321 formed of a rectangular copper foil and negative active material layers 322 including graphite particles (not shown) as negative active material. The negative active material layers 322 are provided on both main faces of the negative current collecting foil 321. Further, the strip-shaped positive electrode plate 31 includes a positive-electrode-plate body portion 31M in which the positive active material layers 312 are each overlapped on the respective main faces of the positive current collecting foil 311 and also a positive-electrode-plate current-collecting portion 31S where the positive current collecting foil 311 extends on one side WH1 (a right side in FIG. 2) in an electrode widthwise direction WH to be exposed. Further, the strip-shaped negative electrode plate 32 includes a negative-electrode-plate body portion 32M in which the negative active material layers 322 are each overlapped on the respective main faces of the negative current collecting foil 321 and also a negative-electrode-plate current-collecting portion 32S where the negative current collecting foil 321 extends on the other side WH2 (a left side in FIG. 2) in the electrode widthwise direction WH to be exposed.

Figure 2:
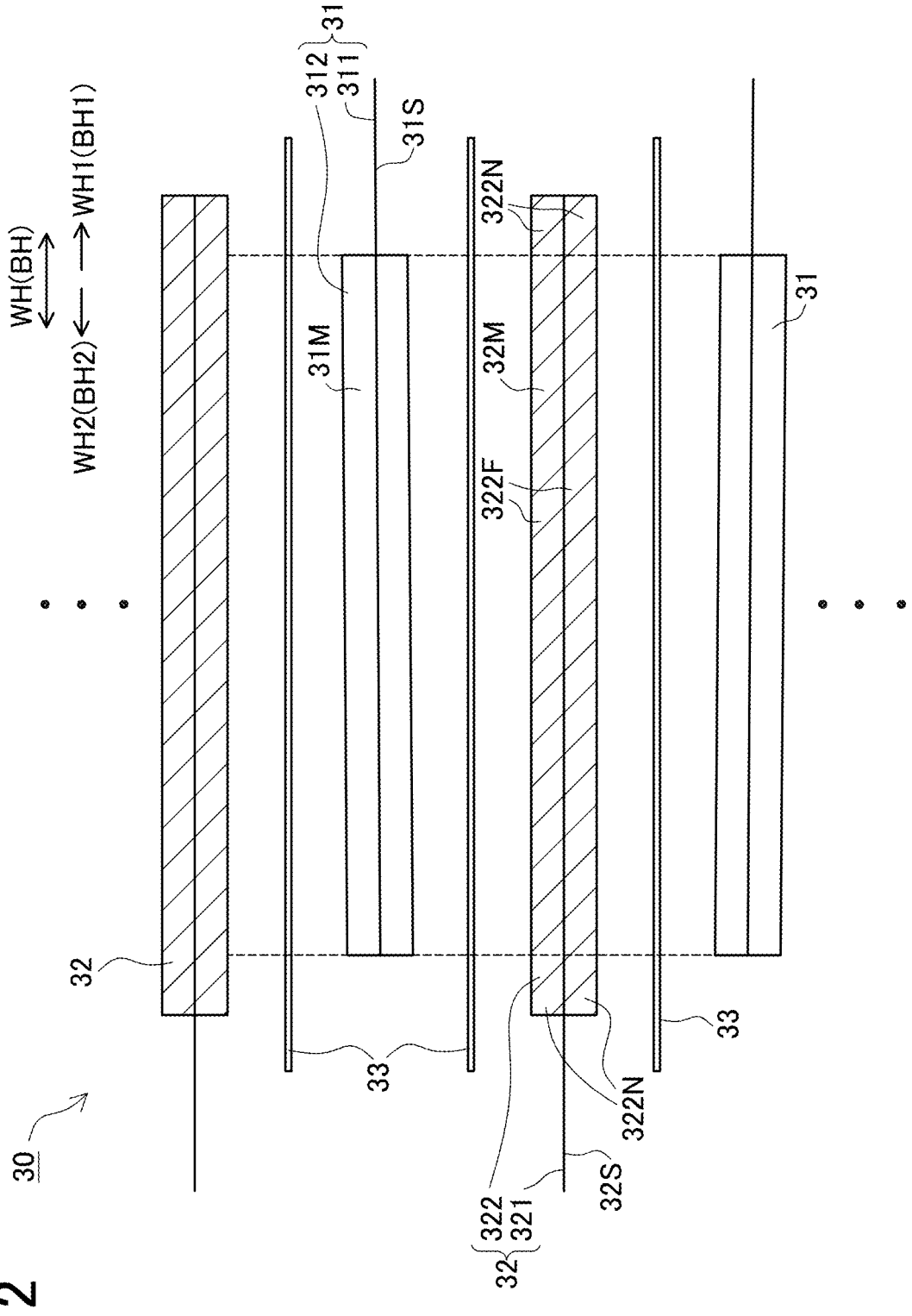
FIG. 2 is an explanatory view for explaining an opposing positional relation of a positive electrode plate and a negative electrode plate which are laminated by winding in the embodiment.

Further, as shown in FIG. 2, a widthwise dimension of the negative-electrode-plate body portion 32M (namely, the negative active material layer 322) of the negative electrode plate 32 is made larger than a widthwise dimension of the positive-electrode-plate body portion 31M (namely, the positive active material layer 312) of the positive electrode plate 31. Furthermore, the positive electrode plate 31 is arranged such that the positive active material layer 312 is placed to definitely oppose the negative active material layer 322 of the negative electrode plate 32 via the separator 33. In other words, the negative active material layer 322 of the negative electrode plate 32 includes an opposing portion 322F opposing the positive active material layer 312 and also non-opposing portions 322N positioned on both sides (left and right positions in FIG. 2) in the electrode widthwise direction WH of the opposing portion 322F not to oppose the positive active material layer 312.

In the electrode body 30, on one side BH1 (a right side in FIG. 1) in the battery widthwise direction BH along the axis 30X, there is provided the positive current collecting portion 35, which is exposed and wound therearound with the positive-electrode-plate current-collecting portion 31S of the positive electrode plate 31 in a spiral shape, and on the other side BH2 (a left side in FIG. 1), there is provided the negative current collecting portion 36, which is exposed and wound therearound with the negative-electrode-plate current-collecting portion 32S of the negative electrode plate 32 in a spiral shape. A center portion in the axis 30X between the positive current collecting portion 35 and the negative current collecting portion 36 is a main body portion 34 where the positive-electrode-plate body portion 31M and the negative-electrode-plate body portion 32M are overlapped and wound.

In the present embodiment, the positive current collecting portion 35 of the electrode body 30 is closely contacted with the connecting portion 35C in the battery thickwise direction CH and laser-welded to the connecting portion 22C of the positive inner terminal member 22 so that the positive current collecting portion 35 is electrically connectable with a circuit component outside the battery 10 by the positive inner terminal member 22 and the positive outer terminal member 23 which constitute the positive terminal 21. Further, the negative current collecting portion 36 of the electrode body 30 is closely contacted with the connecting portion 36C in the battery thickwise direction CH and laser-welded to the connecting portion 26C of the negative inner terminal member 26 so that the negative current collecting portion 36 is electrically connectable with a circuit component outside the battery 10 by the negative inner terminal member 26 and the negative outer terminal member 27 which constitute the negative terminal 25.

In addition, the electrode body 30 is supported by the lid 15 via the positive terminal 21 and the negative terminal 25.

Connection of the connecting portion 35C of the positive current collecting portion 35 with the connecting portion 22C of the positive inner terminal member 22 and connection of the connecting portion 36C of the negative current collecting portion 36 with the connecting portion 26C of the negative inner terminal member 26 in the electrode body 30 may be made by another method such as ultrasonic welding and press-fit caulking.

Figure 3:
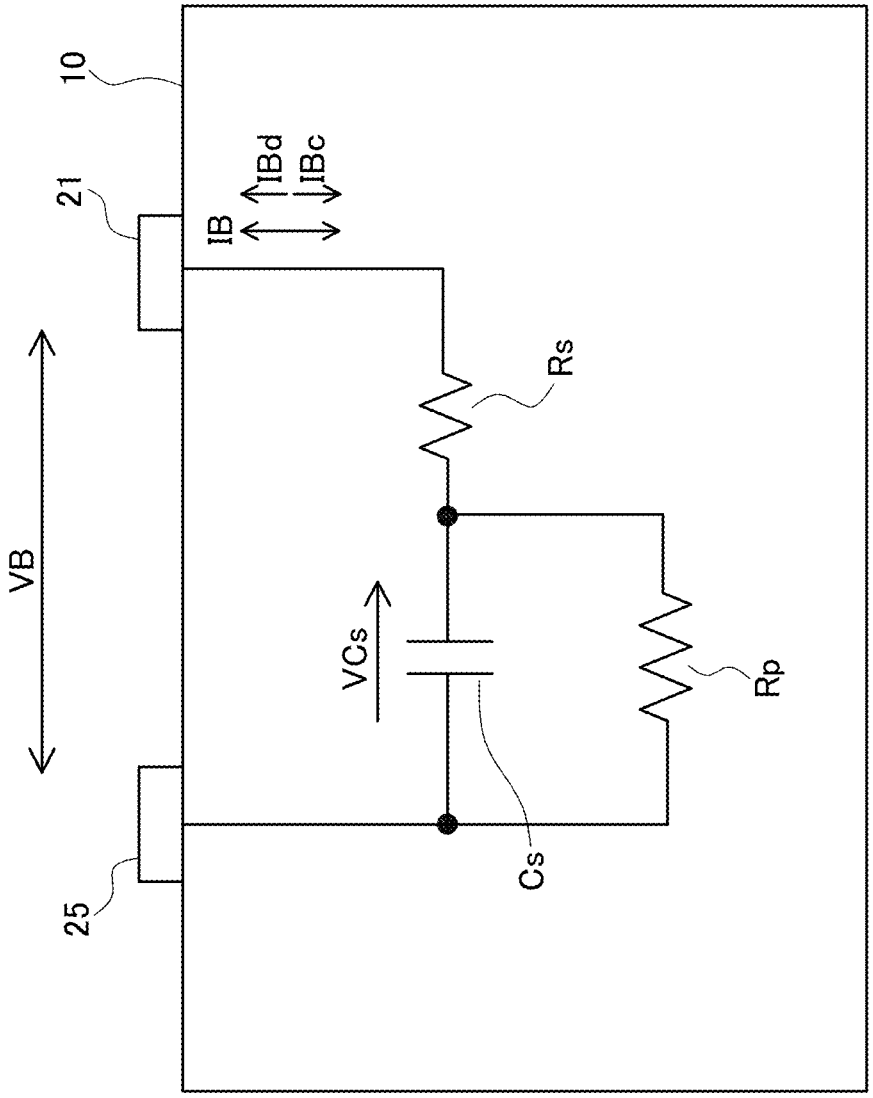
FIG. 3 shows an equivalent circuit of the battery in the embodiment.

Galvanically, the battery 10 is represented by an equivalent circuit in FIG. 3. Namely, the equivalent circuit of the battery 10 is arranged by a battery capacity Cs of the battery 10, a parallel resistance Rp configuring a parallel circuit with the battery capacity Cs and corresponding to an insulation resistance of the battery 10, and a serial resistance Rs which is connected in series with a parallel circuit formed of the battery capacity Cs and the parallel resistance Rp and corresponds to an amount of the resistance in each part of the battery. Thus, when a battery current IB is not applied to the battery 10, a battery voltage VB (an open voltage) becomes equal to a battery capacity voltage VCs generated in the battery capacity Cs. When a charge current IBc is applied to the battery 10, the apparent battery voltage VB is a total amount of the battery capacity voltage VCs added with a voltage (voltage drop) generated in the serial resistance Rs by the charge current IBc. On the other hand, when a discharge current IBd flows from the battery 10, the apparent battery voltage VB is a result of deducting the voltage (voltage drop) generated in the serial resistance Rs by the discharge current IBd from the battery capacity voltage VCs. When the short-circuit is occurred in the battery 10, magnitude of the parallel resistance Rp is smaller than that in a case where no short-circuit occurs, and an electric charge stored in the battery capacity Cs is gradually discharged by self-discharge through the parallel resistance Rp, and thus the battery voltage VB gradually decreases.

Figure 4:
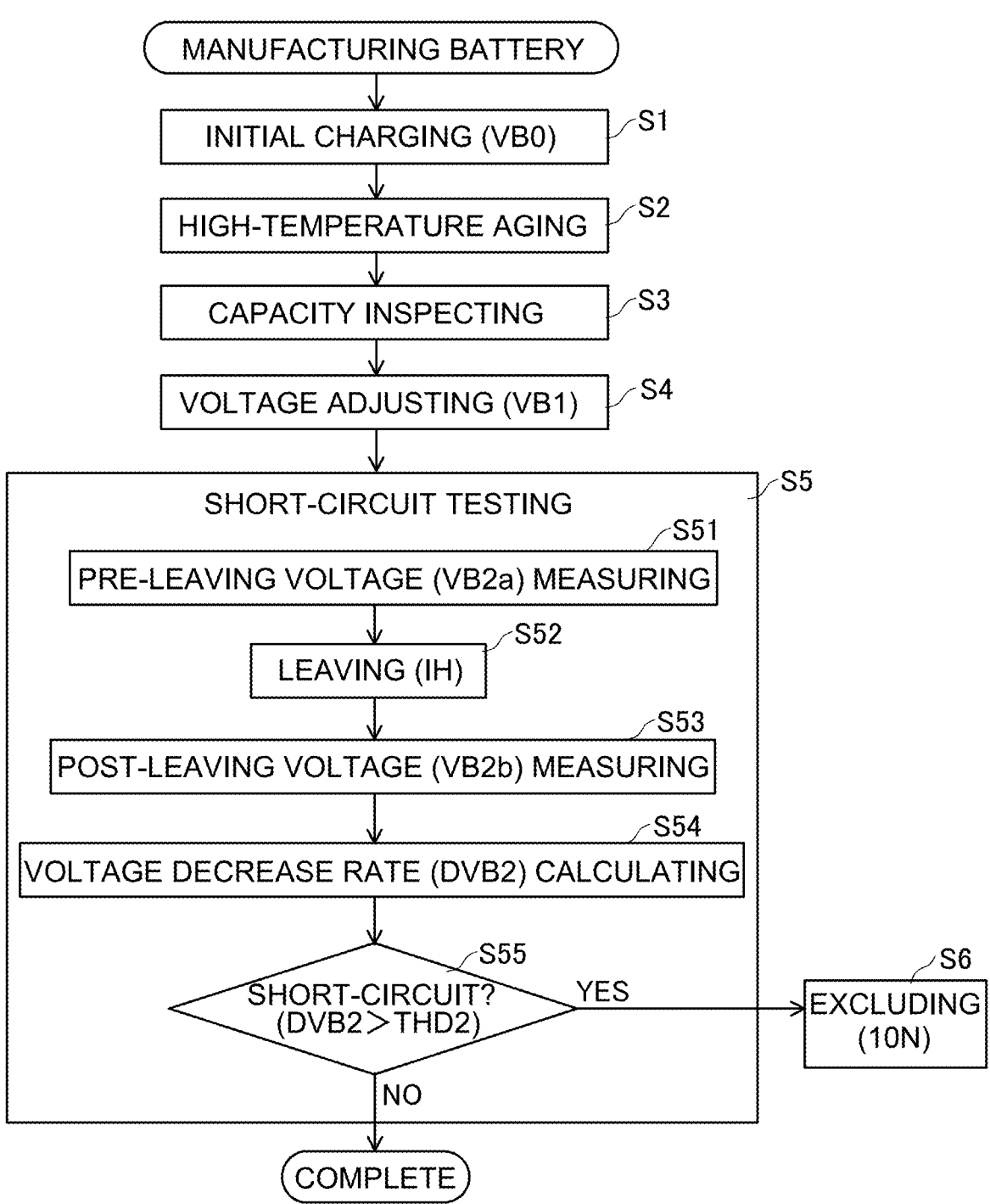
FIG. 4 is a flow chart indicating a manufacturing process of the battery in the embodiment.

Next, a manufacturing method for the battery 10 is explained with reference to FIG. 4. Firstly, the pre-charged battery 10 is manufactured. A manufacturing method for the hermetically-closed battery 10 having the parallelepiped case 11 is a known technique and explanation thereof is omitted.

In an initial charging process S1 (see FIG. 4), the pre-charged battery 10 is initially charged to an initial voltage VB0 of 3.800 V by a method of CCCV charging under a normal temperature. In the present embodiment, for example, under an environment of 25° C., the initial charging is performed by the CCCV charging with a condition of a constant current of 7 C, a cutoff voltage of 3.800 V, a cutoff current of 0.3 C to set the initial voltage VB0 of the battery 10 as VB0=3.800 V.

Subsequently, in a high-temperature aging process S2, high-temperature aging of leaving the battery 10 which has been initially charged in an open state under an environment of 50° C. to 80° C. for 10 to 200 hours (in the present embodiment, for example, under an environment of 70° C. for 18 hours) is performed. After the high-temperature aging process S2, the battery 10 is cooled down. In a subsequent capacity inspecting process S3, the battery 10 is charged to SOC 100%, and then discharged to SOC 0% to measure the capacity (in the above method, a discharge capacity).

Subsequently, in a voltage adjusting process S4, the battery 10 is charged under a normal temperature from the battery voltage VB to a first voltage VB1. The first voltage VB1 is set as a value slightly smaller than the initial voltage VB0 in the initial charging process S1. In the present embodiment (corresponding to an example 1), for example, the CCCV charging with the constant current of 7 C, the cutoff voltage of 3.750 V, and the cutoff current of 0.3 C is performed under an environment of 25° C. Specifically, after the initial charging, the battery voltage VB of the battery 10 that has been performed with the high-temperature aging is once adjusted to the first voltage VB1 (in the present embodiment, VB1=3.750 V).

Subsequently, in a self-discharge testing process S5, the battery 10 having been performed with the voltage adjusting process S4 is performed with self-discharge testing. Specifically, in a pre-leaving voltage measuring process S51, a pre-leaving second voltage VB2a as the battery voltage VB of the battery 10 at that time is measured. As mentioned above, in the voltage adjusting process S4, the battery voltage VB of the battery 10 has been once adjusted to the first voltage VB1 by the CCCV charging. However, instantly after the CCCV charging is completed, the battery voltage VB decreases (by about 1 to 5 mV, for example) within a couple of seconds to a couple of minutes of an elapsed time KT since an adjustment completion time Tc. This is because the battery current IB at the cutoff current value that has been applied at a final term of the CCCV charging is no longer applied due to completion of CCCV charging. Accordingly, the voltage drop that has occurred in the serial resistance Rs of the equivalent circuit (see FIG. 3) no longer occurs, and thus the battery voltage VB decreases. Further, in a case of no short-circuit occurs in the battery 10, the battery voltage VB varies (see FIG. 5) as time goes by because of SEI formation in the positive active material layer and diffusion of Li between the opposing portion 322F and the non-opposing portion 322N of the negative active material layer 322. Accordingly, prior to a leaving process S52 which will be explained next, a pre-leaving second voltage VB2a of the battery 10 is measured.

Herein, in a case the battery 10 equipped for testing is developed with short-circuit (minute short-circuit), the electric charge stored in the battery 10 (the battery capacity Cs, see FIG. 3) is discharged through the parallel resistance Rp with low resistance that has occurred in the short-circuit portion (not shown). In a case where a resistance value of the short-circuit portion with the parallel resistance Rp does not change, the constant current discharge is mostly performed, and thus the battery voltage VB of the battery 10 decreases by an almost constant rate. Namely, in a case where the battery 10 is occurred with short-circuit, variation in the battery voltage VB is a sum of the variation of the battery voltage VB (see FIG. 5) when the battery 10 has no short-circuit as mentioned above and the constant-rate decrease in the battery voltage VB due to the constant current discharge in the short-circuit portion.

Subsequently, in a leaving process S52, the battery 10, in which the positive terminal 21 and the negative terminal 25 are in an open state, is placed in a state being free from binding or a state being slightly bound and left as it is for a predetermined leaving term IH (in the present embodiment, IH≥5.0 days (IH≥120 hours)) under the environment of 25° C. Thereafter, in a post-leaving voltage measuring process S53, a post-leaving second voltage VB2$b$ as the battery voltage VB of the battery 10 after leaving is measured.

In a subsequent decrease rate calculating process S54, a voltage difference (a second voltage decrease amount ΔVB2) between the pre-leaving second voltage VB2$a$ and the post-leaving second voltage VB2$b$ is divided by the actual leaving term IH to calculate a second voltage decrease rate DVB2 (=ΔVB2/IH) as the second voltage decrease amount per unit of time (for example, per a day or per an hour).

A length of the leaving term IH may vary because a timing of performing the post-leaving voltage measuring process S53 per each lot of the batteries, which have been performed with the leaving process S52, is different depending on inclusion or exclusion of weekends in the leaving term IH, presence or absence of delay in the post-leaving voltage measuring process S53, and others. Therefore, in a short-circuit determining process S55 explained below, comparison with a criterion for determination is made easier in a case of utilizing a decrease rate such as the second voltage decrease rate DVB2 than utilizing the voltage difference (the second voltage decrease amount ΔVB2) of the pre-leaving second voltage VB2$a$ and the post-leaving second voltage VB2$b$.

In the short-circuit determining process S55, presence or absence of the short-circuit in the battery 10 is determined by the obtained second voltage decrease rate DVB2. Specifically, it is determined whether the second voltage decrease rate DVB2 is larger than a threshold decrease rate THD2 (DVB2>THD2). When the determination result is No, namely, the second voltage decrease rate DVB2 is smaller than the threshold decrease rate THD2 (DVB2<THD2), the battery 10 is determined not to have the short-circuit. In this manner, the short-circuit determining process S55 is ended and the battery 10 is completed accordingly.

When the determination result in the short-circuit determining process S55 is Yes, namely, the second voltage decrease rate DVB2 is larger than the threshold decrease rate THD2 (DVB2>THD2), the battery 10 is determined to be occurred with the short-circuit, and thus the process proceeds to an excluding process S6. In the excluding process S6, a defective battery 10N which has been determined to cause short-circuit is excluded from the manufacturing process.

Further, in the short-circuit determining process S55, the second voltage decrease rate DVB2 is compared with the threshold decrease rate THD2 to determine only presence or absence of the short-circuit in the battery 10. Alternatively, magnitude of self-discharge may be classified into three or more ranks by the magnitude of the second voltage decrease rate DVB2.

In the manufacturing method and the self-discharge testing method for the above-mentioned battery 10, the pre-leaving second voltage VB2$a$ is measured and the second voltage decrease rate DVB2 is actually measured separately from the voltage adjusting process S4 in which the battery voltage VB is adjusted to the first voltage VB1. Owing to this, presence or absence of the short-circuit in the battery 10 and the magnitude of the self-discharge can be appropriately inspected.

Further, in this manufacturing method for the battery 10, the initial charging is performed and then, in the adjustment testing process (the voltage adjusting process S4 and the self-discharge testing process S5), the self-discharge testing is performed. In the excluding process S6, the battery 10 which is determined to cause the short-circuit is excluded. Thus, only the batteries 10 that have been determined not to cause the short-circuit can be manufactured.

Subsequently, a relation of variations in the battery voltage VB on and after the voltage adjusting process S4 (on and after the adjustment completion time Tc) with the initial voltage VB0, which is obtained by initially charging the battery 10 in the initial charging process S1, and the first voltage VB1, which has reached the voltage adjusting process S4 (in the present embodiment (the example 1), VB0=3.800 V and VB1=3.750 V), is now considered.

Variations in the battery voltage VB on and after the voltage adjusting process S4, namely, on and after the adjustment completion time Tc are explained with reference to FIG. 5 and FIG. 6. The explanation provides examples in which the initial voltage VB0 in the initial charging process S1 is differentiated from one another while the first voltage VB1 (VB1=3.750 V) that has been reached in the voltage adjusting process S4 is made equal to one another. Herein, in a comparative example 1, the initial voltage VB0 is set as VB0=3.750 V as same as the VB1. In the example 1 corresponding to the above-mentioned embodiment, the initial voltage VB0 is set as VB0=3.800 V which is higher than VB1 by 0.050 V=50 mV. In an example 2, the initial voltage VB0 is set as VB0=3.900 V which is higher than the VB1 by 0.150 V=150 mV. In a comparative example 2, the initial voltage VB0 is set as VB0=4.000 V which is higher than the VB1 by 0.250V=250 mV.

Figure 5:
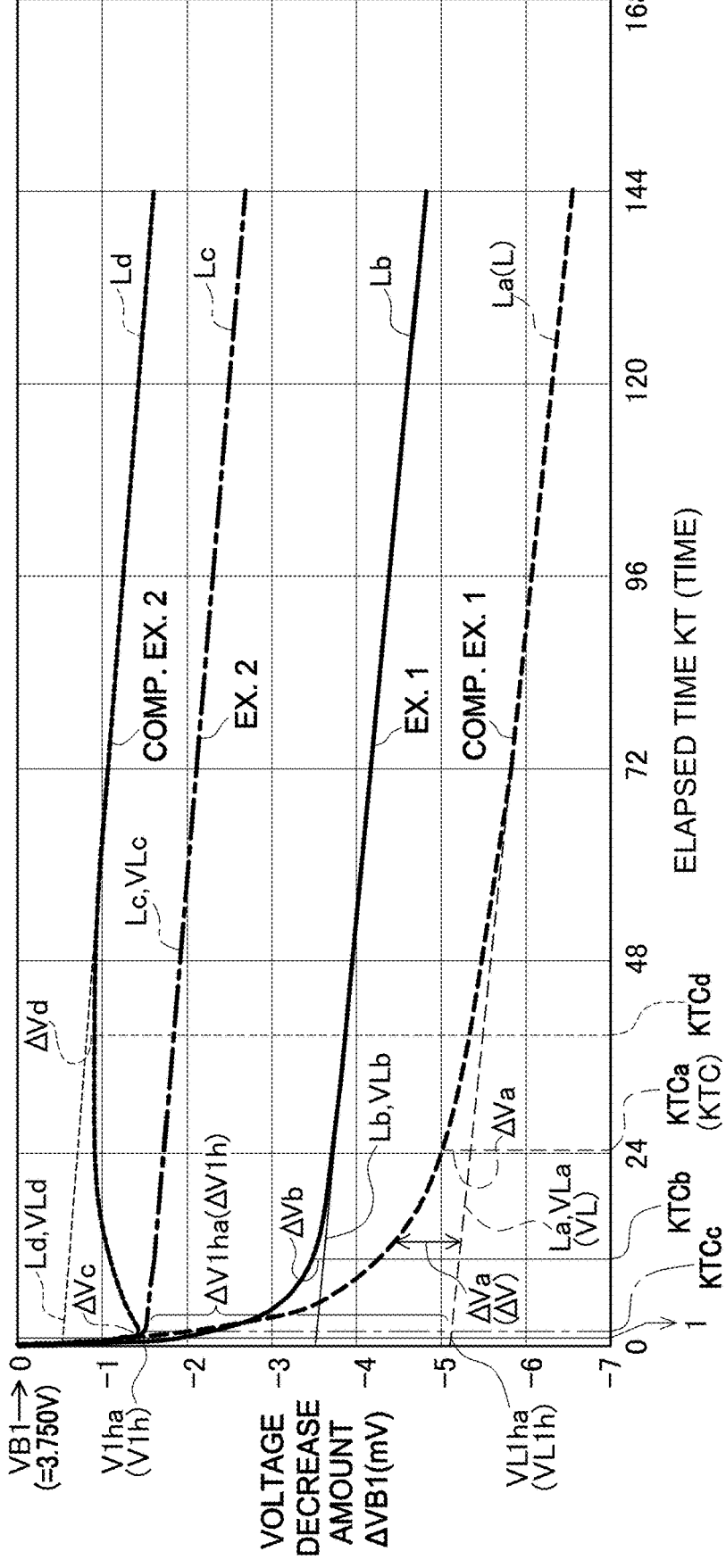
FIG. 5 is a graph showing examples of variations in a battery voltage after a voltage adjusting process of batteries which have no short-circuit according to the batteries in examples 1 and 2 and comparative examples 1 and 2.

FIG. 5 is a graph showing variations in the voltage decrease amount ΔVB1 from the first voltage VB1 (VB1=3.750 V) with respect to the elapsed time KT on and after the adjustment completion time Tc. In the battery 10 of the comparative example 1 (VB0=3.750 V, and VB=3.750 V) indicated with a long-broken line, the battery voltage VB has decreased by about the voltage decrease amount ΔVB1=−1.3 mV in a significantly short time (within a couple of minutes of the elapsed time KT) on and after the adjustment completion time Tc. Further, the voltage has decreased by about the voltage decrease amount ΔVB1=−1.8 mV in one hour (KT=1 hour) of the elapsed time KT. The battery voltage VB has kept sweep decrease thereafter, but the decrease rate gradually slows down as time goes by. On and after about 72 hours of the elapsed time KT, the battery voltage VB is confirmed to decrease almost linearly.

Further, in the battery of the example 1 (VB0=3.800 V and VB1=3.750 V as same as the embodiment) indicated with a solid line in FIG. 5, the battery voltage VB has decreased by about the voltage decrease amount ΔVB1=−1.3 mV in a significantly short time (within a couple of minutes of the elapsed time KT). Furthermore, the battery voltage VB has decreased by about the voltage decrease amount ΔVB1=−2.1 mV in one hour of the elapsed time KT (KT=1 hour). The battery voltage VB has kept sweep decrease thereafter, but the battery voltage decrease amount ΔVB1 is smaller than that of the comparative example 1. The decrease in the battery voltage VB gradually slows down as time goes by, and on and after about 48 hours of the elapsed time KT, the battery voltage VB is confirmed to decrease almost linearly.

In the battery 10 of the example 2 (VB0=3.900 V and VB1=3.750 V) indicated with a chain-dotted line in FIG. 5, the battery voltage VB has decreased by about the voltage decrease amount ΔVB1=−1.3 mV in a significantly short time (within a couple of minutes of the elapsed time KT).

Furthermore, the battery voltage VB has decreased by about the voltage decrease amount $\Delta VB1=-1.5$ mV in one hour of the elapsed time KT (KT=1 hour). However, unlike the comparative example 1 and the example 1, on and after about 2 hours of the elapsed time KT, the battery voltage VB is confirmed to decrease almost linearly. Specifically, the battery 10 of this example 2 is confirmed to have less period of term when the battery voltage VB gradually decreases as time goes by like the batteries 10 in the comparative example 1 and the example 1.

Further, in the battery 10 of the comparative example 2 (VB0=4.000 V and VB1=3.750 V) indicated with a short-broken line in FIG. 5, the battery voltage VB has decreased by about the voltage decrease amount $\Delta VB1=-1.3$ mV in a significantly short time (within a couple of minutes of the elapsed time KT). Furthermore, the battery voltage VB has decreased by about the voltage decrease amount $\Delta VB1=-1.5$ mV in one hour of the elapsed time KT (KT=1 hour). However, unlike the above-mentioned three examples, on and after that, until the elapsed time KT has reached 24 hours, the battery voltage VB is increased on the contrary, namely, the voltage decrease amount $\Delta VB1$ is increased. Then, after the battery voltage VB has been kept almost constant, the battery voltage VB is confirmed to linearly decrease on and after about 60 hours of the elapsed time KT.

Firstly, behavior of the battery voltage VB (the voltage decrease amount $\Delta VB1$) on and after the adjustment completion time Tc in the battery 10 of the comparative example 1 is considered. It is understood that the battery voltage VB has largely decreased to the first voltage VB1 within a couple of minutes instantly after the adjustment completion time Tc because the battery current IB is no longer applied to the serial resistance Rs by completion of the CCCV charging as mentioned above. This variation in the battery voltage VB seems to be similar in other three examples of the example 1, the example 2, and the comparative example 2.

As for the battery 10 of the comparative example 1, it is also understood that the battery voltage VB has almost linearly decreased on and after the elapsed time KT of 72 hours because of the voltage decrease due to the SEI coating formation on the surface of the active material particles as mentioned above. This voltage decrease due to the SEI coating formation occurs for about a several tens of days to a several hundreds of days, and thus the voltage decrease appears to be almost linear during a term of about a couple of days to a week (up to 170 hours) on and after the adjustment completion time Tc. The linear voltage decrease on and after the elapse time KT of 48 hours in the battery 10 of the example 1, the linear voltage decrease on and after the elapse time KT of 2 hours in the battery 10 of the example 2, and the linear voltage decrease on and after the elapse time KT of 60 hours in the battery 10 of the comparative example 2 are also considered to be the voltage decrease due to the above-mentioned SEI coating formation.

On the other hand, in the battery 10 of the comparative example 1, a part of the voltage decrease occurred on and after several minutes since the adjustment completion time Tc until elapse of 72 hours (KT=72 hours) except the influence of the voltage decrease due to the above-mentioned SEI coating formation is considered to be caused by variation in the Li concentration (namely, Li diffusion) between the opposing portion 322F and the non-opposing portion 322N of the negative active material layer 322 as mentioned above. This variation in the Li concentration is explained with FIG. 6. FIG. 6 is an explanatory table for explaining the Li concentration and the Li diffusion in the positive active material layer 312 and the negative active material layer 322 of the respective batteries 10. The table illustrates the Li concentration in the positive active material layer 312 and the opposing portion 322F and the non-opposing portion 322N of the negative active material layer 322 at each timing of a column (a) at a time before initial charging, a column (b) at a time of completion of the initial charging, a column (c) at a time after the high-temperature aging, a column (d) at a time of adjusting completion, and a column (e) at a time after adjusting completion.

Firstly, in the battery 10 of the comparative example 1, before the initial charging as illustrated in the column (a), the Li exists in the positive active material layer 312, but no Li exists in the negative active material layer 322. However, after the initial charging process S1 (after initial charging) to make the battery voltage VB to the initial voltage VB0 (in the comparative example 1, VB0=3.750 V), a part of the Li in the positive active material layer 312 is transferred to the opposing portion 322F of the negative active material layer 322 opposing the positive active material layer 312 and inserted into the negative active material. However, at this time, the non-opposing portion 322N of the negative active material layer 322, which is not opposing the positive active material layer 312, includes no Li. Namely, there is occurred a concentration gap $\Delta C$ between an opposing-portion concentration CF as an Li concentration in the opposing portion 322F and a non-opposing-portion concentration CN as an Li concentration in the non-opposing portion 322N. Accordingly, Li atoms are forwardly diffused from the opposing portion 322F to the non-opposing portion 322N as indicated with outward arrows in the figure in order to lessen this concentration gap $\Delta C$. As a result of this, after performing the high-temperature aging process S2 to leave the battery 10 under a high temperature as shown in the column (c) (after high-temperature aging), the opposing-portion concentration CF of the opposing portion 322F and the non-opposing-portion concentration CN of the non-opposing portion 322N become similar to each other by the forward diffusion of the Li, and thus the concentration gap $\Delta C$ is eliminated. The non-opposing-portion concentration CN at this time of after high-temperature aging is slightly lower than the opposing-portion concentration CF after initial charging as shown in the column (b).

Thereafter, the capacity inspecting process S3 is performed and then the voltage adjusting process S4 is performed as mentioned above so that the battery voltage VB is adjusted to the first voltage VB1 which is equal to the initial voltage VB0 (in the comparative example 1, VB1=VB0=3.750 V). As a result of this, the Li is supplied to the opposing portion 322F from the positive active material layer 312, and accordingly, the opposing-portion concentration CF at the time of the adjustment completion time Tc in the column (d) becomes similar to the one after the initial charging indicated in the column (b). On the other hand, the Li is not supplied to the non-opposing portion 322N, and thus the non-opposing-portion concentration CN after the high-temperature aging indicated in the column (c) is maintained. In other words, at the voltage adjustment completion time Tc indicated in the column (d), the opposing portion concentration CF is slightly higher than the non-opposing-portion concentration CN to cause the concentration gap $\Delta C$. To address this for eliminating the concentration gap $\Delta C$ on and after the adjustment completion time Tc, the Li atoms are forwardly diffused from the opposing portion 322F to the non-opposing portion 322N as indicated with outward arrows in the column (e). Accordingly, while the opposing-portion concentration CF gradually decreases, the non-opposing-portion concentration CN gradually increases, and as a result of this, the opposing-portion concentration CF and the non-opposing-portion concentration CN are made equal to each other.

Herein, local negative-electrode potential in each portion of the negative active material layer 322 is influenced by the Li concentration in the subject portion. Namely, the higher the Li concentration is, the lower the local negative-electrode potential in the subject portion becomes. The negative-electrode potential of the negative electrode plate 32 is a total potential of the local negative-electrode potential in the respective portions. In the negative active material layer 322 of the battery 10 in the present embodiment, an area of the opposing portion 322F is larger than an area of the non-opposing portion 322N (see FIG. 2), and thus the negative-electrode potential of the negative electrode plate 32 is almost equal to the negative-electrode potential of the opposing portion 322F. Herein, the battery voltage VB represents the voltage difference of the positive-electrode potential of the positive electrode plate (the positive active material layer 312) and the negative-electrode potential of the negative electrode plate 32.

Therefore, on and after the adjustment completion time Tc when the battery voltage VB is adjusted to the first voltage VB1 in the voltage adjusting process S4, the opposing-portion concentration CF gradually decreases by the Li forward diffusion as the elapsed time KT goes by. Along with this, the negative-electrode potential of the opposing portion 322F, and further the negative-electrode potential of the negative electrode plate 32 are gradually increased while the battery voltage VB gradually decreases. Herein, this decrease in the battery voltage VB by the Li diffusion is terminated on and after the adjustment completion time Tc with elapse of about 72 hours (KT=72 hours) as indicated with the long-broken line in FIG. 5 in the comparative example 1.

On and after the adjustment completion time Tc indicated in the column (e) of the comparative example 1, the battery voltage VB decreases by the Li forward diffusion. This may be because the initial voltage VB0 is made equal to the first voltage VB1, so that the non-opposing-portion concentration CN has become lower than the opposing-portion concentration CF at the adjustment completion time Tc indicated in the column (d).

Subsequently, behavior of the battery voltage VB (the voltage decrease amount ΔVB1) in the batteries 10 in the examples 1 and 2 is considered. Decrease in the battery voltage VB instantly after the adjustment completion time Tc, the linear voltage decrease on and after the elapse time KT of 48 hours in the battery 10 of the example 1, and the linear voltage decrease on and after the elapsed time KT of 2 hours in the battery 10 of the example 2 have already been explained.

A part of the voltage decrease occurred on and after several minutes from the adjustment completion time Tc until lapse of 48 hours or 2 hours except the voltage decrease influenced by the above-mentioned SEI coating formation in the batteries 10 in the examples 1 and 2 is considered to be caused by variation in the Li concentration in the opposing portion 322F and the non-opposing portion 322N of the negative active material layer 322 as mentioned above. This variation in the Li concentration in the batteries 10 of the examples 1 and 2 is also explained with FIG. 6.

Figure 6:
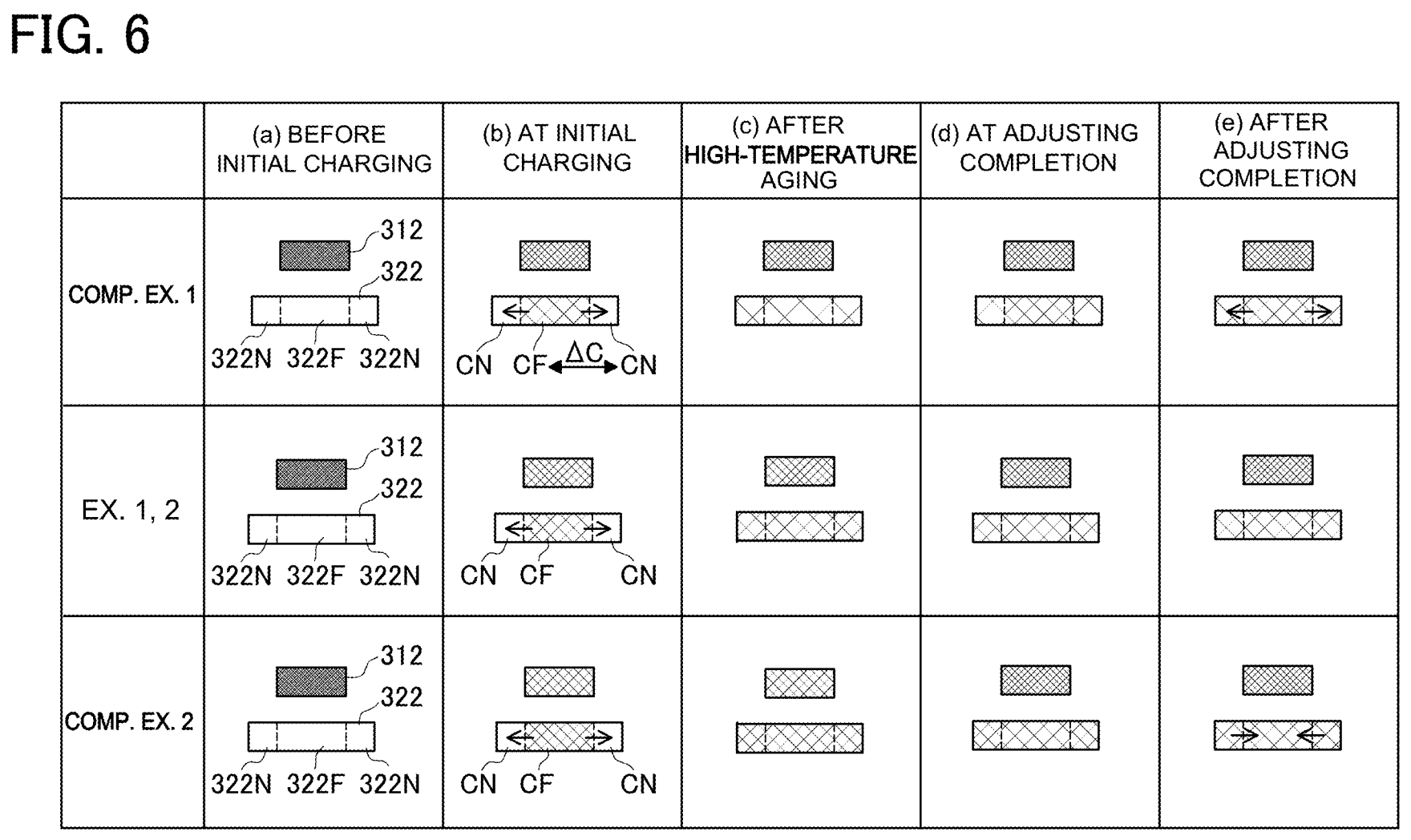

In the batteries 10 of the examples 1 and 2, before the initial charging indicated in the column (a) in FIG. 6, the Li exists in the positive active material layer 312, but no Li exists in the negative active material layer 322 as similar to the comparative example 1. However, after performing the initial charging process S1 (after initially charging) indicated in the column (b) to make the battery voltage VB to the initial voltage VB0 (in the example 1, VB0=3.800 V, and in the example 2, VB0=3.900 V), the Li is inserted in the negative active material in the opposing portion 322F. At this time, no Li exists in the non-opposing portion 322N of the negative active material layer 322 which is not opposing the positive active material layer 312. However, the initial voltage VB0 is made higher than that of the comparative example 1, and thus the Li concentration (the opposing-portion concentration CF) in the opposing portion 322F is made high.

Thereafter, the Li atoms are forwardly diffused toward the non-opposing portion 322N from the opposing portion 322F in order to lessen the concentration gap ΔC. Accordingly, after performing the high-temperature aging process S2 (after high-temperature aging) indicated in the column (c), the opposing-portion concentration CF of the opposing portion 322F and the non-opposing-portion concentration CN of the non-opposing portion 322N are made almost equal by the Li forward diffusion, thereby eliminating the concentration gap ΔC. The non-opposing-portion concentration CN at this time after the high-temperature aging is somehow lower than the opposing-portion concentration CF after the initial charging as indicated in the column (b), but the non-opposing-portion concentration CN of the batteries 10 in the examples 1 and 2 is relatively higher than the comparative example 1.

Thereafter, the capacity inspecting process S3 is performed, and then the voltage adjusting process S4 is performed as mentioned above so that the battery 10 is charged to adjust the battery voltage VB to the first voltage VB1 (in the examples 1 and 2, VB1=3.750 V which is equal to the comparative example 1). As a result of this, the Li is supplied to the opposing portion 322F from the positive active material layer 312, and accordingly, the opposing-portion concentration CF at the time of the adjustment completion time Tc in the column (d) becomes similar to the one after the initial charging indicated in the column (b). On the other hand, the Li is not supplied to the non-opposing portion 322N, and thus the non-opposing-portion concentration CN after the high-temperature aging indicated in the column (c) is maintained. However, at the adjustment completion time Tc in the column (d), the opposing-portion concentration CF becomes almost similar to the non-opposing-portion concentration CN unlike the comparative example 1. Namely, as compared with the comparative example 1, the concentration gap ΔC at the voltage adjustment completion time Tc is small in the example 1, and the concentration gap ΔC is rarely generated in the example 2. Therefore, as understood from the column (e) in which no arrows are indicated on and after the adjustment completion time Tc in the example 1 and 2, the diffusion transfer of the Li atoms between the opposing portion 322F and the non-opposing portion 322N in the example 1 is smaller than in the comparative example 1 or the diffusion transfer rarely occurs in the example 2.

Accordingly, on and after the adjustment completion time Tc in the voltage adjusting process S4, the decrease in the battery voltage VB associated with the Li forward diffusion in the example 1 indicated with the solid line in FIG. 5 is terminated in a short time (after elapse of about 48 hours (KT=48 hours)) as compared with the comparative example 1 indicated with the long-broken line. Further, in the example 2 indicated with the chain-dotted line in FIG. 5, the decrease in the battery voltage VB associated with the Li forward diffusion rarely occurs, and thus the decrease is terminated in a significantly short time (within 2 hours (KT≤2 hours)).

In these examples 1 and 2, the variation in the voltage decrease amount ΔVB1 due to the Li diffusion rarely occurs on or after the adjustment completion time Tc because the initial voltage VB0 is appropriately made larger than the first voltage VB1, so that it can be considered that the non-opposing-portion concentration CN at the adjustment completion time Tc in the column (d) becomes the Li concentration almost equal to the opposing-portion concentration CF.

Subsequently, behavior of the battery voltage VB (the voltage decrease amount ΔVB1) of the battery 10 in the comparative example 2 is considered. Decrease in the battery voltage VB directly after the adjustment completion time Tc and the linear voltage decrease of the battery 10 in the comparative example 2 on and after the elapsed time KT of 60 hours have already been described.

In the battery 10 of the comparative example 2, a part of rise (namely, increase in the battery voltage VB) or keeping of the voltage decrease amount ΔVB1, which has occurred on or after several minutes from the adjustment completion time Tc to the time before elapse of 60 hours, except the voltage decrease influenced by the above-mentioned SEI coating formation is also considered to be caused by the variation in the Li concentration in the opposing portion 322F and the non-opposing portion 322N of the above-mentioned negative active material layer 322. This variation in the Li concentration in the battery 10 of the comparative example 2 is also explained with FIG. 6.

In the battery 10 of the comparative example 2 before the initial charging indicated in the column (a) in FIG. 6, the Li exists in the positive active material layer 312 as similar to the comparative example 1 and the examples 1 and 2, but after performing the initial charging process S1 (after initially charging) to make the battery voltage VB to the initial voltage VB0 (in the comparative example 2, VB0=4.000 V), the Li is inserted in the negative active material in the opposing portion 322F. At this time, no Li exists in the non-opposing portion 322N of the negative active material layer 322. However, the initial voltage VB0 is made further higher than that of the comparative example 1 and the examples 1 and 2, and thus the Li concentration (the opposing-portion concentration CF) in the opposing portion 322F is further heightened.

Thereafter, the Li atoms are forwardly diffused toward the non-opposing portion 322N from the opposing portion 322F in order to lessen the concentration gap ΔC. Accordingly, after performing the high-temperature aging process S2 (after high-temperature aging) to leave the battery 10 under a high-temperature environment as indicated in the column (c), the opposing-portion concentration CF of the opposing portion 322F and the non-opposing-portion concentration CN of the non-opposing portion 322N are made almost equal by the Li forward diffusion, thereby eliminating the concentration gap ΔC. The non-opposing-portion concentration CN at this time after the high-temperature aging is somehow lower than the opposing-portion concentration CF after the initial charging as indicated in the column (b), but the non-opposing-portion concentration CN of the battery 10 of the comparative example 2 is further higher than the other three examples.

Thereafter, the capacity inspecting process S3 is performed, and then the voltage adjusting process S4 is performed as mentioned above so that the battery 10 is charged to make the battery voltage VB to the first voltage VB1 (also in the comparative example 2, VB1=3.750 V which is equal to the other three examples). As a result of this, the Li is supplied to the opposing portion 322F from the positive active material layer 312, and accordingly, the opposing-portion concentration CF at the adjustment completion time Tc in the column (d) becomes similar to the one after the initial charging in the column (b). On the other hand, the Li is not supplied to the non-opposing portion 322N, and thus the non-opposing-portion concentration CN after the high-temperature aging in the column (c) is maintained. However, unlike the other three examples, the opposing-portion concentration CF has become "lower" than the non-opposing-portion concentration CN at the adjustment completion time Tc in the column (d). Namely, at the voltage adjustment completion time Tc, there is occurred the concentration gap ΔC which is inverse or negative from the one in the other three examples. Accordingly, in this comparative example 2, the Li atoms are inversely diffused toward the opposing portion 322F from the non-opposing portion 322N as indicated with inward arrows in the column (e) on or after the adjustment completion time Tc.

In the comparative example 2, accordingly, the opposing-portion concentration CF gradually increases by the Li inverse diffusion as the elapsed time KT goes by on and after the adjustment completion time Tc in the voltage adjusting process S4, and in association with this, the negative-electrode potential of the opposing portion 322F and the negative-electrode potential of the negative electrode plate 32 gradually decrease. As a result of this, the battery voltage VB gradually increases, and thus the voltage decrease amount ΔVB1 also increases. In FIG. 5, increase in the battery voltage VB of the battery 10 in the comparative example 2 gets settled after lapse of about 24 hours since this increase includes the influence of the voltage decrease due to the above-mentioned SEI coating formation. This increase in the battery voltage VB by the Li inverse diffusion is terminated on or after the adjustment completion time Tc after the lapse of about 60 hours (KT=60 hours) as indicated with the short-broken line in FIG. 5.

In the comparative example 2, there is occurred the increase in the voltage decrease amount ΔVB1 (increase in the battery voltage VB) by the Li inverse diffusion on or after the adjustment completion time Tc because it can be considered that the initial voltage VB0 has been made far larger than the first voltage VB1, so that the non-opposing-portion concentration CN becomes higher than the opposing-portion concentration CF at the adjustment completion time Tc in the column (d).

To address the above, a variation settled time KTC of a separation amount (a variation amount) of the battery voltage VB, which is caused by the Li diffusion transfer between the opposing portion 322F and the non-opposing portion 322N as mentioned above, is determined as follows with utilizing a graph indicating variations in the voltage decrease amount ΔVB1 (or the first voltage VB1) at the elapsed time KT on and after the adjustment completion time Tc as shown in FIG. 5. Firstly, variation in the battery voltage VB is inspected in a period of term from the adjustment completion time Tc when the battery voltage VB has been adjusted to the first voltage VB1 in the voltage adjusting process S4 to the time when the battery voltage VB decreases along a straight line L (specifically, the straight lines La to Ld of the comparative examples 1 and 2 and the examples 1 and 2 in FIG. 5) up to the elapsed time KT of 144 hours, for example. Subsequently, the above-mentioned line L (specifically, lines La to Ld) is extended to a left side in FIG. 5 to go back in time to the adjustment completion time Tc (the elapsed time KT=0). Next, a one-hour-later separation amount $\Delta V1h$, specifically, $\Delta V1ha$ to $\Delta V1hd$ are respectively obtained by a formula $V1h$-$VL1h$ as a gap between the battery voltage VB after lapse of one hour from the adjustment completion time Tc (KT=1 hour), which is hereinafter referred as one-hour-later voltage $V1h$. A value on the line L is also obtained and this value is hereinafter referred as one-hour-later on-line value $VL1h$. In relation to the one-hour-later separation amount $\Delta V1h$, only a one-hour-later voltage $V1ha$, a one-hour-later on-line value $VL1ha$, and a one-hour-later separation amount $\Delta V1ha$ are illustrated in FIG. 5 for convenience of reference. When the separation amount $\Delta V$ of the obtained battery voltage VB and the above-mentioned value on the line L, which is hereinafter referred as an on-line value VL, specifically indicated as VLa to VLd in FIG. 5, has been reduced to 10% of the one-hour-later separation amount $\Delta V1h$ ($\Delta V1ha$ to $\Delta V1hd$), the elapsed time KT required for this reduction is determined as the variation settled time KTC (KTCa to KTCd).

As shown in FIG. 5, the variation settled time KTCa of the battery 10 in the comparative example 1 is 24.5 hours (KTCa=24.5 hours). The variation settled time KTCb of the battery 10 in the example 1 is 13.2 hours (KTCb=13.2 hours). The variation settled time KTCc of the battery 10 in the example 2 is 1.8 hours (KTCc=1.8 hours). Further, the variation settled time KTCd of the battery 10 in the comparative example 2 is 38.7 hours (KTCd=38.7 hours).

As mentioned above, the variation settled time KTC has been obtained in advance for preceding samples of the battery 10 with the same product number or the same lot. For example, the initial voltage VB0 with the settled time KTC of 17.0 hours or less (KTC≤17.0 hours) is chosen. According to the comparative examples 1 and 2 and the examples 1 and 2 indicated in FIG. 5, for example, the initial voltage VB0 is set within a range of 3.78 V to 3.95 V with respect to the first voltage VB1 as 3.750 V, so that the variation settled time KTC can be set within 17.0 hours.

In other words, as mentioned above, in adjusting the battery voltage VB to the first voltage VB1 in the voltage adjusting process S4, the magnitude of the first voltage VB1 is arranged such that the variation settled time KTC for the variation amount $\Delta V$ of the battery voltage VB varied by the Li diffusion is 17 hours or less (about 0.7 days) since the adjustment completion time Tc. When the self-discharge testing process S5 is started instantly after the adjustment completion time Tc, the self-discharge testing can be accurately performed with less influence of the variation in the battery voltage VB due to the Li diffusion. In another example of starting the self-discharge testing process S5, after the variation of the battery voltage VB due to the Li diffusion has become small enough, the self-discharge testing process S5 can be started earlier such as one day after the adjustment completion time TC, for example, and thus the self-discharge testing can be finished early.

Furthermore, the initial voltage VB0 may be selected such that the variation settled time KTC is 5.0 hours or less (KTC≤5.0 hours). For example, according to the comparative examples 1 and 2 and the examples 1 and 2 as shown in FIG. 5, the initial voltage VB0 is set to be within a range of 3.83 to 3.92 V with respect to the first voltage VB1 of 3.750 V, so that the variation settled time KTC can be made within 5.0 hours.

As mentioned above, the first battery VB1 is set such that the variation settled time KTC is within 5 hours (about 0.2 days). When the self-discharge testing process S5 is started instantly after the adjustment completion time Tc, the self-discharge testing can be performed more accurately, or the self-discharge testing method can be started further earlier.

The present disclosure has been explained with the embodiment (the examples 1 and 2) as above, but the present disclosure is not limited to the embodiment and may be applied with appropriate modifications without departing from the scope of the disclosure.

For example, in the examples 1 and 2 and the comparative examples 1 and 2, while the first voltage VB1 to be adjusted in the voltage adjusting process S4 is fixed as VB1=3.750 V, the initial voltage VB0 in the preceding initial charging process S1 is differentiated in the respective examples. Then, an appropriate range of the initial voltage VB0 is obtained to make the variation settled time KTC to be equal to or less than 17.0 hours or equal to or less than 5.0 hours, for example, the initial voltage VB0 within this range is selected.

Alternatively, the first voltage VB1 in the voltage adjusting process S4 may be set as long as the above-mentioned variation settled time KTC is made short, such as within 17.0 hours (KTC≤17.0 hours) or within 5.0 hours (KTC≤5.0 hours).

Accordingly, on the contrary to the examples 1 and 2, and others, in the battery 10 as a preceding sample, the initial voltage VB0 is fixed such as VB0=3.750 V while the first voltage VB1 in the voltage adjusting process S4 is differentiated in the respective examples. Then, an appropriate range of the first voltage VB1 for setting the variation settled time KTC to be within 17.0 hours or within 5.0 hours is obtained, and then the first voltage VB1 to be set for the voltage adjusting process S4 may be selected from this range.

Further, in the embodiment, the battery 10 is charged to the SOC 100% in the capacity testing process S3 during the manufacturing process of the battery 10, and thereafter the battery 10 is discharged to the SOC 0% and the capacity of the battery 10 is measured. In the subsequent voltage adjusting process S4, the battery 10 is charged to make the battery voltage VB to be the first voltage VB1. Alternatively, the battery 10 may be discharged to the SOC 0% in the capacity testing process, and thereafter, the battery 10 may be charged to the SOC 100% to measure the charged capacity of the battery 10. Thereafter, the battery voltage VB may be adjusted to the first voltage VB1 by discharging in the voltage adjusting process S4.

In the embodiment and others, a relation of the first voltage VB1 in the voltage adjusting process S4 performed prior to the self-discharge testing process S5 and the initial voltage VB0 in the initial charging process S1 during the manufacturing process of the battery 10 is considered. Alternatively, a battery 10 which has already been finished with the manufacturing process and appeared on the market, specifically a battery which has already been used for a device such as a vehicle or a battery 10 which has been collected from the market for reuse may be applied. Namely, when the self-discharge testing is to be performed for these batteries 10, the first voltage VB1 to be adjusted in the voltage adjusting process preceding the self-discharge testing process may only have to have the magnitude such that the variation settled time KTC of the variation amount $\Delta V$ of the battery voltage VB varied due to the Li diffusion between the opposing portion 322F and the non-opposing portion 322N is within 17.0 hours or within 5.0 hours, for example.

REFERENCE SIGNS LIST

10 Battery (secondary battery)
10N Defective battery (secondary battery that have been determined to cause short-circuit)
21 Positive terminal
25 Negative terminal
30 Electrode body
31 Positive electrode plate
312 Positive active material layer
32 Negative electrode plate
322 Negative active material layer
322F Opposing portion
322N Non-opposing portion
CF Opposing-portion concentration
CN Non-opposing-portion concentration
ΔC Concentration gap
34 Main body
Cs Battery capacity (of a battery)
VCs Battery capacity voltage
Rs Serial resistance (of a battery)
Rp Parallel resistance (of a battery)
IB Battery current
IBc Charging current
IBd Discharging current
VB Battery voltage
VB0 Initial voltage
VB1 First voltage (first battery voltage)
ΔVB1 Voltage decrease amount
ΔV, ΔVa to ΔVd Separation amount (variation amount of the battery voltage varied by diffusion of charge carrier atoms)
ΔV1$h$, ΔV1$ha$ to ΔV1$hd$ One-hour-later separation amount
VB2$a$ Pre-leaving second voltage (pre-leaving battery voltage)
VB2$b$ Post-leaving second voltage (post-leaving battery voltage)
DVB2 Second voltage decrease rate (measured voltage decrease rate)
Tc Adjustment completion time
KT Elapsed time
KTC, KTCa to KTCd Variation settled time
S1 Initial charging process
S4 Voltage adjusting process (adjusting testing process)
S5 Self-discharge testing process (adjusting testing process)
S51 Pre-leaving voltage adjusting process
S52 Leaving process
IH Leaving term (predetermined term)
S53 Post-leaving voltage measuring process
S54 Decrease amount calculating process (Measuring process)
S55 Short-circuit determining process (self-discharge determining process)
S6 Excluding process

What is claimed is:

1. A method of self-discharge test for a secondary battery comprising an electrode body provided with a positive electrode plate including a positive active material layer and a negative electrode plate including a negative active material layer,
the negative active material layer including an opposing portion opposing the positive active material layer and a non-opposing portion failing to oppose the positive active material layer, wherein the method includes:
adjusting a battery voltage to a first battery voltage by any one of charging and discharging of the secondary battery; and
self-discharge testing a state of self-discharge of the secondary battery by variation in the battery voltage for a predetermined term for which the secondary battery is kept in a terminal open state, and
the adjusting the battery voltage is to adjust the first battery voltage having magnitude which satisfies a variation settled time of 17 hours or less from adjustment completion time of adjusting the battery voltage to the first battery voltage, the variation settled time being a time of settling a variation amount of the battery voltage varied by diffusion of charge carrier atoms that are diffused to lessen a concentration gap between an opposing-portion concentration as a concentration of the charge carrier atoms existing in the opposing portion of the negative active material layer and a non-opposing-portion concentration as a concentration of the charge carrier atoms existing in the non-opposing portion of the negative active material layer.

2. The method of self-discharge test for the secondary battery according to claim 1, wherein the adjusting the battery voltage is to adjust the magnitude of the first battery voltage with the variation settled time of 5 hours or less from the adjusting completion time.

3. The method of self-discharge test for the secondary battery according to claim 1,
wherein the self-discharge testing includes:
measuring a pre-leaving battery voltage of the secondary battery;
leaving the secondary battery, which has been measured with the pre-leaving battery voltage, in the terminal open state for the predetermined term;
measuring a post-leaving battery voltage of the secondary battery after the leaving the secondary battery;
measuring a measured voltage decrease rate between the pre-leaving battery voltage and the post-leaving battery voltage of the secondary battery; and
determining a magnitude of self-discharge of the secondary battery by use of the measured voltage decrease rate of the secondary battery.

4. A manufacturing method for a secondary battery, the method including:
initial charging the secondary battery to an initial voltage;
adjusting and testing a magnitude of self-discharge of the secondary battery by the self-discharge testing according to claim 1; and
excluding the secondary battery that has been determined to have short-circuit in the self-discharge testing.

5. The method of self-discharge test for the secondary battery according to claim 2,
wherein the self-discharge testing includes:
measuring a pre-leaving battery voltage of the secondary battery;
leaving the secondary battery, which has been measured with the pre-leaving battery voltage, in the terminal open state for the predetermined term;
measuring a post-leaving battery voltage of the secondary battery after the leaving the secondary battery;

measuring a measured voltage decrease rate between the pre-leaving battery voltage and the post-leaving battery voltage of the secondary battery; and determining a magnitude of self-discharge of the secondary battery by use of the measured voltage decrease rate of the secondary battery.

6. A manufacturing method for a secondary battery, the method including:

initial charging the secondary battery to an initial voltage;

adjusting and testing a magnitude of self-discharge of the secondary battery by the self-discharge testing according to claim 2; and excluding the secondary battery that has been determined to have short-circuit in the self-discharge testing.

7. A manufacturing method for a secondary battery, the method including:

initial charging the secondary battery to an initial voltage;

adjusting and testing a magnitude of self-discharge of the secondary battery by the self-discharge testing according to claim 3; and excluding the secondary battery that has been determined to have short-circuit in the self-discharge testing.

8. A manufacturing method for a secondary battery, the method including:

initial charging the secondary battery to an initial voltage;

adjusting and testing a magnitude of self-discharge of the secondary battery by the self-discharge testing according to claim 5; and excluding the secondary battery that has been determined to have short-circuit in the self-discharge testing.

\*    \*    \*    \*    \*